(12) United States Patent
Huang et al.

(10) Patent No.: US 10,699,938 B2
(45) Date of Patent: Jun. 30, 2020

(54) SHALLOW TRENCH ISOLATION STRUCTURE AND METHOD OF FORMING THE SAME

(71) Applicant: TAIWAN SEMICONDUCTOR MANUFACTURING COMPANY, LTD., Hsinchu (TW)

(72) Inventors: Yen-Bin Huang, Hsinchu (TW); Chien-Mao Chen, Zhubei (TW); Yu-Hsuan Kuo, Taipei (TW); Shih-Kai Fan, Hsinchu (TW); Chia-Hung Lai, Hsinchu (TW); Kang-Min Kuo, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 141 days.

(21) Appl. No.: 13/945,608

(22) Filed: Jul. 18, 2013

(65) Prior Publication Data

US 2015/0021700 A1    Jan. 22, 2015

(51) Int. Cl.
*H01L 29/06* (2006.01)
*H01L 21/762* (2006.01)
*H01L 21/3065* (2006.01)
*H01L 21/306* (2006.01)
*H01L 21/308* (2006.01)

(52) U.S. Cl.
CPC .... *H01L 21/76232* (2013.01); *H01L 21/3065* (2013.01); *H01L 21/3083* (2013.01); *H01L 21/30608* (2013.01)

(58) Field of Classification Search
CPC ......... H01L 29/66795; H01L 21/76224; H01L 21/76229; H01L 21/76264; H01L 21/76267; H01L 21/76283
See application file for complete search history.

(56) References Cited

U.S. PATENT DOCUMENTS

| H000204 H * | 2/1987 | Oh ................................ 257/397 |
| 6,255,689 B1 * | 7/2001 | Lee ...................... H01L 27/115 257/314 |
| 6,294,419 B1 * | 9/2001 | Brown .............. H01L 21/76232 257/E21.549 |
| 6,313,008 B1 * | 11/2001 | Leung ............... H01L 21/76232 257/510 |
| 8,120,094 B2 * | 2/2012 | Liaw ............... H01L 21/823878 257/328 |
| 8,936,995 B2 * | 1/2015 | Tilke ................. H01L 21/76229 438/424 |
| 2014/0021526 A1 * | 1/2014 | Yao ................... H01L 27/11558 257/316 |

* cited by examiner

*Primary Examiner* — Marcos D. Pizarro
*Assistant Examiner* — Quinton A Brasfield
(74) *Attorney, Agent, or Firm* — Hauptman Ham, LLP

(57) ABSTRACT

A semiconductor structure includes a shallow trench isolation (STI) structure. The semiconductor structure includes a substrate having a first surface. A STI structure extends from the first surface into the substrate. The STI structure includes a first portion and a second portion. The first portion extends from the first surface into the substrate, and has an intersection with the first surface. The second portion extends away from the first portion, and has a tip at a distance away from the intersection in a direction parallel to the first surface. The first portion and the second portion are filled with a dielectric material.

20 Claims, 3 Drawing Sheets

SHALLOW TRENCH ISOLATION STRUCTURE AND METHOD OF FORMING THE SAME

TECHNICAL FIELD

This disclosure relates generally to a semiconductor structure and, more particularly, to a shallow trench isolation structure and method of forming a shallow trench isolation structure.

BACKGROUND

Shallow trench isolation (STI) structure is an isolation technology in an Integrated circuit (IC) device. One of the purposes of STI is to prevent carriers, such as electrons or electron-holes, from drifting between two adjacent device elements through a semiconductor substrate to cause a current leakage.

Integrated circuit technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices.

Due to device scaling, improvements to IC devices are continually being made to further improve STIs.

BRIEF DESCRIPTION OF THE DRAWINGS

Aspects of the present disclosure may be understood from the following detailed description and the accompanying FIGURES. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure having a shallow trench isolation (STI) structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

FIGS. 1A to 1H are cross-sectional views of a semiconductor structure 200 having a STI structure at various stages of manufacture according to various embodiments of this disclosure. Additional processes may be provided before, during, or after FIGS. 1A to 1H. Various FIGURES have been simplified for a better understanding of the inventive concepts of the present disclosure.

Figure 1B:
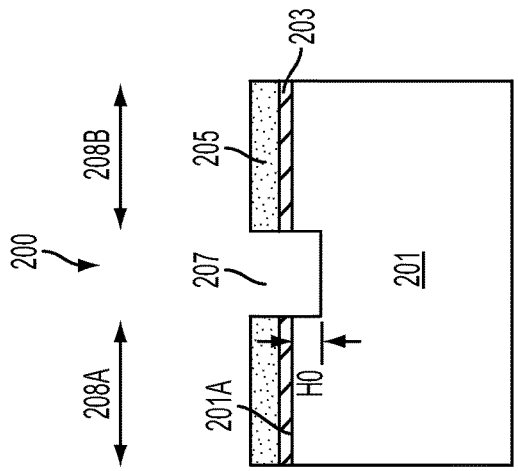
FIGS. 1A to 1H are cross-sectional views of semiconductor structures having a shallow trench isolation structure at various stages of manufacture according to one or more embodiments of this disclosure.
Figure 1D:
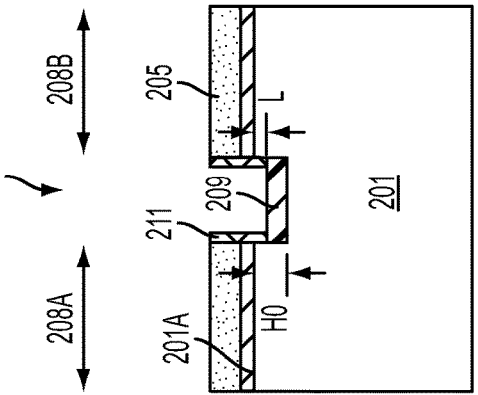
Figure 1A:
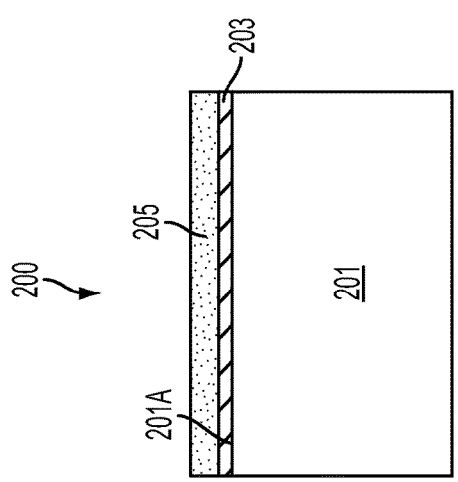

Referring to FIG. 1A, which is an enlarged cross-sectional view of a portion of the semiconductor structure 200 having a STI structure. The semiconductor structure 200A includes a substrate 201 such as a silicon carbide (SiC) substrate, GaAs, InP or Si/Ge. In the examples in FIGS. 1A-1H, the substrate 201 is a silicon substrate. The substrate 201 has a first surface 201A. A pad dielectric layer 203, for example an oxide layer, is formed over the first surface 201A by a chemical vapor deposition (CVD) or a thermal oxidation process. The pad dielectric layer 203 is a thin layer and may reduce the stress of the later formed masking layer 205 and the substrate 201. In some examples, the pad dielectric layer 203 has a thickness in a range substantially from 3 nm to 20 nm.

A masking layer 205 is formed over the pad dielectric layer 203. The masking layer 205 may comprise silicon nitride, oxynitrides or silicon carbide. The masking layer 205 may be formed by plasma enhanced chemical vapor deposition (PECVD), low pressure chemical vapor deposition (LPCVD), or other suitable processes. In some examples, the masking layer 205 has a thickness in a range substantially from 80 nm to 200 nm.

Referring to FIG. 1B, which is a cross-sectional view of a portion of the semiconductor structure 200 after a first opening 207 is formed in the substrate 201. In some examples, the masking layer 205 and the pad dielectric layer 203 are patterned through suitable photolithographic and etching processes to expose a portion of the substrate 201. Once the masking layer 205 has been patterned, the exposed portion of the substrate 201 is removed to form the first opening 207. The first opening 207 extends from the first surface 201A with a depth $H_0$ into the substrate 201. In some embodiments, the depth $H_0$ is in a range substantially from 200 nm to 300 nm. The first opening 207 includes a sidewall surface and a bottom surface. The first opening 207 is formed by a suitable process such as reactive ion etching (RIE) to remove the exposed portion of the substrate 201. The first opening 207 separates two adjacent active regions 208A and 208B.

The active regions 208A-B are electrically conductive regions of the substrate 201 adjacent to the first surface 201A of the substrate 201. The active regions 208A-B will be used for components of semiconductor devices (such as transistors, resistors, diodes, etc.) to be formed later. The active regions 208A-B may be implanted with suitable materials into the crystal substrate in later processes. Depending upon the materials chosen, the active regions 208A-B may comprise either an n-well or a p-well, as determined by the design considerations.

Figure 1C:
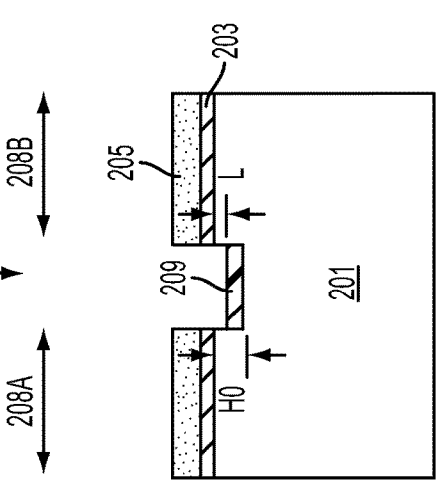

Referring to FIG. 1C, a sacrificial material 209 is partially filled in a bottom portion of the first opening 207. The sacrificial material 209 has a different etching resistance compared to the masking layer 205. The sacrificial material 209 could be selectively removed and leaves the masking layer 205 remained in the later process. In certain examples, the sacrificial material 209 includes an oxide layer. In some examples, the sacrificial material 209 is filled in the bottom portion of the first opening 20 with a thickness in a range substantially from 5 nm to 30 nm. A top surface of the sacrificial material 209 is lower than the first surface 201A of the substrate 201 (also lower than a top of the first opening 207). The sidewall surface of the first opening 207 not filled by the sacrificial material 209 has a length L in a direction vertical to the first surface 201A. In some embodiments, the length L of the exposed sidewall surface of the first opening 207 is in a range substantially from 200 nm to 300 nm.

Referring to FIG. 1D, a dielectric liner 211 is formed over the exposed sidewall surface of the first opening 207. The dielectric liner 211 is also over sidewall surfaces of the patterned masking layer 205 and pad dielectric layer 203. The dielectric liner 211 covers the length L of the exposed sidewall surface of the first opening 207. The dielectric liner 211 has a different etching resistance compared to the sacrificial material 209. The sacrificial material 209 could be selectively removed and the dielectric liner 211 is remained in the later process. In certain examples, the dielectric liner 211 includes a nitride layer. The dielectric liner 211 may be formed by plasma enhanced chemical vapor deposition (PECVD), high aspect ratio process (HARP) deposition, or other suitable processes. In some embodiments, a dielectric material is conformally deposited over the masking layer 205, along the sidewall surface of the patterned masking layer 205 and pad dielectric layer 203, along the exposed sidewall surface of the first opening 20, and over the top surface of the sacrificial material 209. The dielectric material is anisotropically etched without lithography patterning process to form the dielectric liner 211 along the sidewall surface of the patterned masking layer 205 and pad dielectric layer 203, and along the exposed sidewall surface of the first opening 207.

Figure 1F:
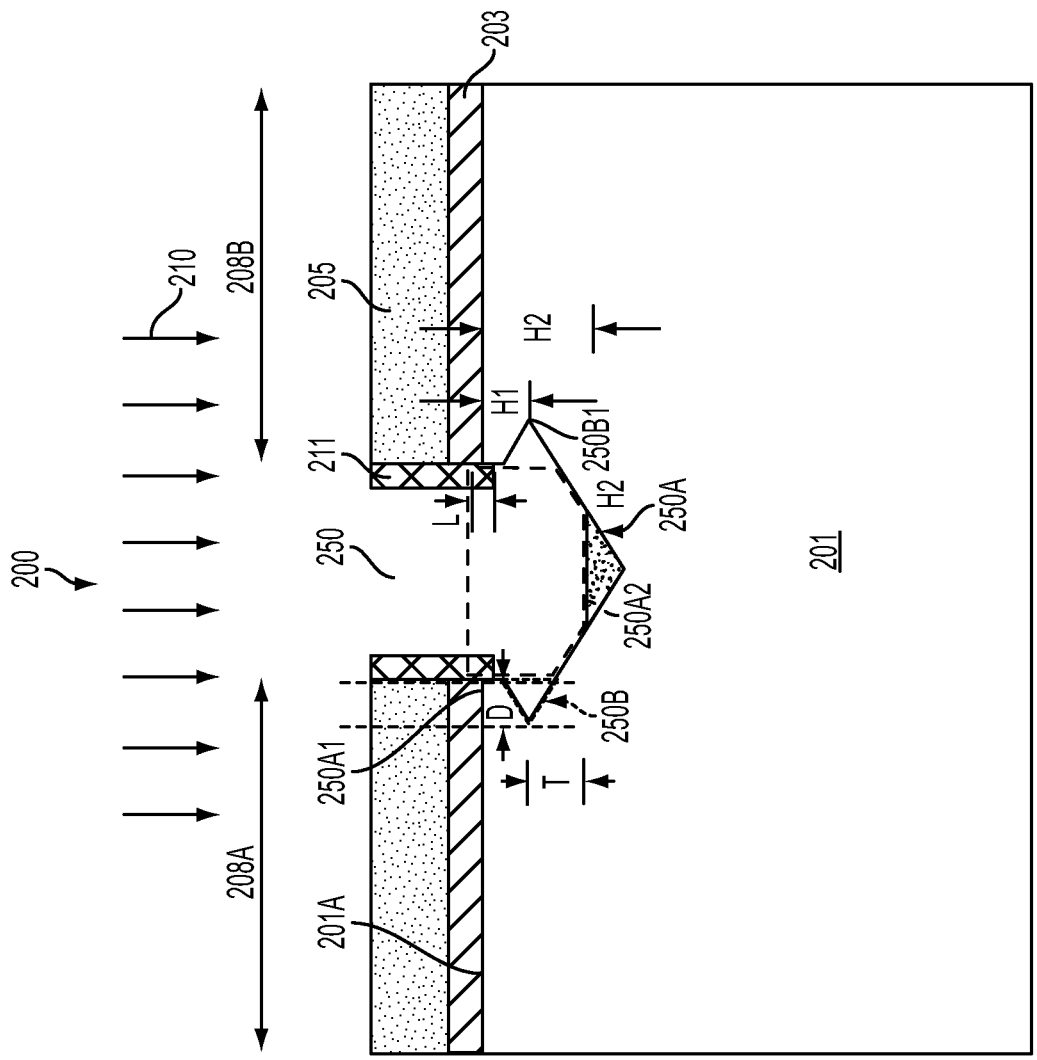
Figure 1E:
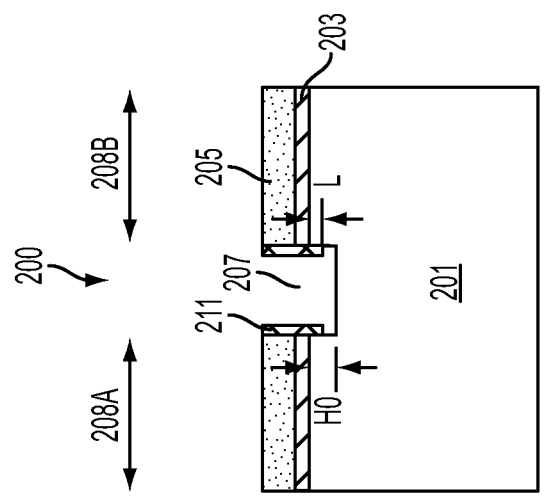

Referring to FIG. 1E, the sacrificial material 209 is selectively removed, and the dielectric liner 211 and the masking layer 205 are remained. The bottom portion of the first opening 207 occupied by the sacrificial material 209 is exposed. In some examples, the sacrificial material 209 is removed by a dry etching process such as a reactive ion etching (RIE) process, or a wet etching process.

Referring to FIG. 1F, an etching process 210 is performed to enlarge the first opening 207 to a second opening 250. The second opening 250 includes a first portion 250A and a second portion 250B. The first portion 250A extends from the first surface 201A with a depth $H_2$ into the substrate 201. The depth $H_2$ is deeper than the depth $H_0$. In certain embodiments, the depth $H_2$ is larger than 310 nm. The first portion 250A has an intersection $250A_1$ with the first surface 201. The first portion 250A also has a bottom surface $250A_2$. The first portion 250A has a sidewall surface with the length L extending from the intersection $250A_1$ into the substrate 201. As previously mentioned, the length L is in a range substantially from 200 nm to 300 nm in some embodiments. The second portion 250B extends away from the first portion 250A and underlies one or both of the active regions 208A-B. The second portion 250B has a tip $250B_1$. The tip $250B_1$ is at a depth $H_1$ less than the depth $H_2$ and at a distance D away from the intersection $250A_1$ in a direction parallel to the first surface 201. In some embodiments, the depth $H_1$ is larger than 285 nm. In some embodiments, the distance D is larger than 25 nm. In some embodiments, a distance T from the tip $250B_1$ of the second portion 250B to a bottom surface of the first portion 250A is larger than 20 nm.

In certain examples as illustrated in FIG. 1F, the etching process 210 is an anisotropic wet etching process that removes silicon at orientation plane dependent rates. The anisotropic wet etching process provides a crystallographically anisotropic etch behavior, which the removal rate in at least one crystallographical orientation may be significantly reduced compared to one or more other crystallographical orientations. In at least one example, a wet etching solution including tetra methyl ammonium hydroxide (TMAH) at about 2.5% by weight is used to etch the substrate 201. The anisotropic wet etching process laterally etches the substrate 201 to form the second portion 250B of the second opening 250 and also vertically etches the substrate 201 to deepen the first opening 207 into the first portion 250A of the second opening 250.

In some examples, the etching process 210 is an isotropic dry etching process with substantially equal vertical and horizontal etch rates to form the second portion 250B of the second opening 250 in a direction parallel to the first surface 201 and form the first portion 250A of the second opening 250 in a direction vertical to the first surface 201. An etchant of the dry etching process includes $NF_3$, $Cl_2$, $SF_6$, He, Ar or $CF_4$.

In at least one example, an implantation process is performed through the opening 207 into the substrate 201 before the etching process 210. The implantation process introduces impurities such as boron into the substrate 201. The impurities may lower an etching rate of the etching process 210 of the substrate 201 and help to accurately control the depth $H_2$ of the second opening 250.

The dielectric liner 211 is removed after the formation of the second opening 250 by a dry etching process, or a wet etching process.

Figure 1H:
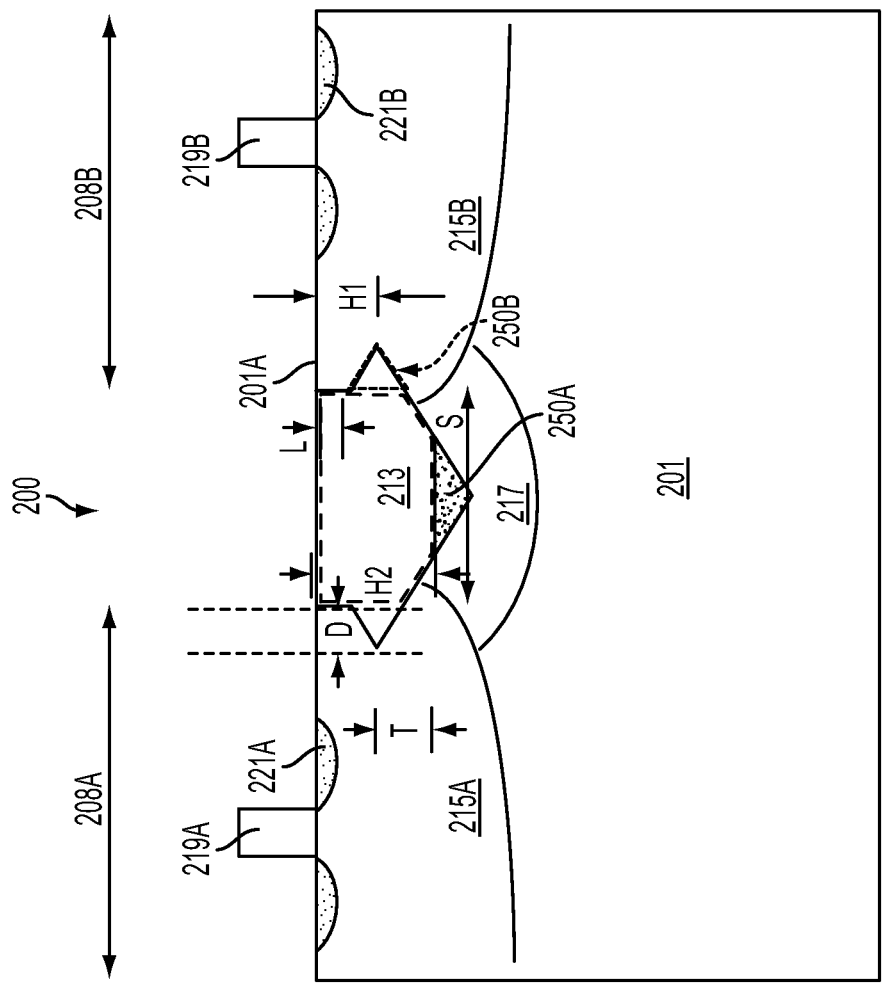
Figure 1G:
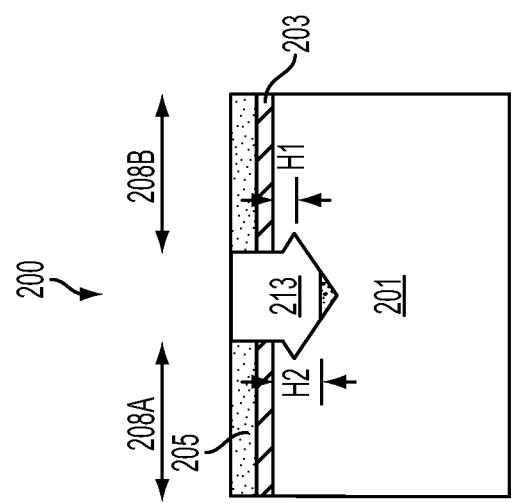

Referring to FIG. 1G, the first portion 250A and the second portion 250B of the second opening 250 are filled with at least one dielectric material to form a shallow trench isolation (STI) structure 213. The at least one dielectric material may comprise silicon oxide, silicon nitride, silicon oxynitride, fluoride-doped silicate glass (FSG), other suitable insulating materials, and/or combinations thereof. In certain examples, the second opening 250 is filled with two dielectric materials with different compositions. In some examples, the second opening 250 is filled with a dielectric material with different methods for bottom and top sections of the second opening 250. The bottom section of the second opening 250 may be filled by a flowable silicon oxide using a spin dielectric (SOD) such as silicate. The flowable silicon oxide is capable of filling the narrow and deep gaps and prevents voids in the second opening 250. The top section of the second opening 250 may be filled by high density plasma (HDP) CVD oxide layer. The dielectric material in the top section of the second opening 250 and the dielectric material in bottom section of the second opening 250 have different density and different etching resistances.

After the at least one dielectric material overfilling the second opening 250 and the masking layer 105, the excess dielectric material outside the second opening 250 and the masking layer 105 is removed through a planarization process such as chemical mechanical polishing (CMP) or an etch process. The shallow trench isolation (STI) structure 213 is formed in the first portion 250A and the second portion 250B of the second opening 250.

Further process steps may be performed to remove the excess at least one dielectric material of the STI structure 213, the masking layer 105 and the pad dielectric layer 203 to expose the first surface 201A of the active regions 208A-B.

Referring to FIG. 1H, doped regions 215A and 215B are formed in the active regions 208A and 208B, respectively. The doped regions 215A and 215B act as well regions for the active regions 208A-B for transistors formation. In the illustrated example, the substrate 201 is a p-type substrate. P-type dopants that the substrate 201 is doped with include boron, gallium, indium, other suitable p-type dopants, or combinations thereof. The doped regions 215A and 215B have n-type conductivity, which is opposite to the substrate 201. The n-type dopants for the doped regions 215A-B may include phosphorus, arsenic, other suitable n-type dopants or combinations thereof. In certain examples, the doped regions 215A-B are formed by implantation processes with the dopants through the first surface 201A into the substrate 201. Advantageously, the second portion 250B of the STI structure 213 extends laterally underlying the active regions 208A-B and blocks some dopants penetrating through the STI structure 213 into portions of the doped regions 215A-B underlying the second portion 250B. With the distance D and the depth $H_1$ of the second portion 250B as the previously mentioned values, the doped regions 215A and 215B are separated with a larger space S compared with structures in accordance with other approaches. The examples in this disclosure prevent carriers, such as electrons or electron-holes, from drifting between two adjacent active regions 208A-B through the space S in the substrate 201 to cause a current leakage. The electrical performances of the semiconductor structure 200 are improved.

The semiconductor structure 200 further includes an isolation doped region 217 formed underlying the first portion 205A of the STI structure 213 and between the doped regions 215A-B. In this illustrated example, the isolation doped region 217 has p-type conductivity, which is opposite to the doped regions 215A-B. P-type dopants that the substrate 201 is doped with include boron, gallium, indium, other suitable p-type dopants, or combinations thereof. The isolation doped region 217 further prevents carriers drifting between two adjacent active regions 208A-B through the space S in the substrate 201.

The semiconductor structure 200 further includes metal-oxide semiconductor (MOS) transistors formation on the active regions 208A-B. In this illustrated example, p-channel MOS (PMOS) transistors are formed on the active regions 208A-B. The PMOS transistor in the active regions 208A includes a gate stack 219A and source/drain regions 221A having p-type conductivity formed in the n-type well 215A. Likewise, the PMOS transistor in the active regions 208B includes a gate stack 219B and source/drain regions 221B having p-type conductivity formed in the n-type well 215B. In some examples, the gate stacks 219A and 219B include silicon gate electrodes and oxide gate dielectric layers. The material of silicon gate electrodes includes single crystal silicon, polycrystalline silicon or amorphous silicon.

In certain examples, the gate stacks 219A and 219B include high-k metal gate electrodes and high-k dielectric layers. In some embodiments, the material of high-k metal gate electrode includes a p-metal layer and a conductive material layer. The p-metal includes a metal-based material having a work function compatible to form P-type transistor. For one example, the p-metal has a work function of about or greater than about 5.2 eV. In some embodiments, the p-metal includes titanium nitride (TiN), tantalum nitride (TaN), tungsten nitride (WN), titanium aluminum (TiAl), or combinations thereof. In certain embodiments, the material of high-k metal gate electrode includes a n-metal layer and a conductive material layer. The n-metal has a work function of about or less than about 4.2 eV. The high-k dielectric layer may include hafnium oxide, hafnium silicon oxide, hafnium silicon oxynitride, hafnium tantalum oxide, hafnium titanium oxide, hafnium zirconium oxide or other suitable high-k dielectric materials.

This disclosure is not limited to the above conditions for forming a STI structure 213 between adjacent PMOS transistors, different conditions that compatible to form adjacent active regions for components of semiconductor devices are within the scope of this disclosure. In various examples, the doped regions including p-type conductivity regions and/or n-type conductivity regions can be configured respectively depending on design considerations.

One aspect of the disclosure describes a semiconductor structure including a shallow trench isolation (STI) structure. The semiconductor structure includes a substrate having a first surface. A STI structure extends from the first surface into the substrate. The STI structure includes a first portion and a second portion. The first portion extends from the first surface with a depth into the substrate, and has an intersection with the first surface. The second portion extends away from the first portion, and has a tip at a distance away from the intersection in a direction parallel to the first surface. The first portion and the second portion are filled with a dielectric material.

A further aspect of the disclosure describes a semiconductor structure including a shallow trench isolation (STI) structure. The semiconductor structure includes a substrate having a first active region and a second active region, and a first surface. A STI structure extends from the first surface into the substrate between the first active region and the second active region. The STI structure includes a first portion and a second portion. The first portion extends form the first surface with a first depth into the substrate, and has a sidewall surface. The second portion extends away from the first portion, and has a tip with a second depth less than the first depth. The first portion and the second portion are filled with at least one dielectric material.

The present disclosure also describes an aspect of a method of forming a semiconductor structure including a shallow trench isolation (STI) structure. The method includes forming a first opening in a substrate having a first surface. The first opening is formed extending from the first surface into the substrate. An etching process is performed to enlarge the first opening to a second opening. The second opening includes a first portion and a second portion. The first portion extends from the first surface with a depth into the substrate, and has an intersection with the first surface. The second portion extends away from the first portion, and has a tip at a distance away from the intersection in a direction parallel to the first surface. The first portion and the second portion of the second opening are filled with at least one dielectric material to form a STI structure.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A semiconductor structure, comprising:
    a substrate having a first surface;
    a shallow trench isolation (STI) structure extending from the first surface into the substrate, the STI structure comprising:
        a first portion extending from the first surface into the substrate, the first portion having an intersection with the first surface; and
        a second portion extending away from the first portion, the second portion having a tip at a distance away from the intersection in a direction parallel to the first surface, a dielectric material filling the first portion and the second portion, and a shape of the tip is defined based on crystallographic planes of the substrate,
        wherein the dielectric material in the first portion directly contacts the substrate, wherein
        the first portion has a sidewall surface extending from the intersection into the substrate,
        the sidewall surface is substantially perpendicular to the first surface, and
        a bottom of the STI structure forms a second tip in a direction perpendicular to the first surface;
    a first doped region in the substrate, the first doped region being adjacent to the STI structure on a first side of the STI structure, the first doped region having a first conductivity type, and the first doped region directly contacts the first portion and the second portion;
    a second doped region in the substrate, the second doped region being adjacent to the STI structure on a second side of the STI structure opposite the first side, the second doped region having a second conductivity type; and
    a third doped region in the substrate, the third doped region being under the STI structure and between the first doped region and the second doped region, the third doped region having a third conductivity type, wherein a maximum depth of the third doped region is greater than a maximum depth of the first doped region and a maximum depth of the second doped region, the third doped region contacts at least two sidewalls of the STI structure, the third doped region directly contacts the first doped region and the second doped region, and sidewalls of the second portion above the tip are free of the third doped region,
    wherein the third conductivity type is different from the first conductivity type and the second conductivity type, and
    at least two sidewalls of the STI structure are each covered by two doped regions with different conductivity types.

2. The semiconductor structure of claim 1, wherein the sidewall surface is a first sidewall surface, the first portion has a second sidewall surface extending from the first surface into the substrate, and the first sidewall surface and the second sidewall surface have substantially equal lengths.

3. The semiconductor structure of claim 2, wherein the length of the first sidewall surface is in a range substantially from 200 nm to 300 nm.

4. The semiconductor structure of claim 1, wherein a depth of the first portion from the first surface is larger than 310 nm.

5. The semiconductor structure of claim 1, wherein the distance is larger than 25 nm.

6. The semiconductor structure of claim 1, wherein a distance from the tip of the second portion to a bottom surface of the first portion is larger than 20 nm.

7. A semiconductor structure, comprising:
    a substrate including a first active region and a second active region, and having a first surface;
    a shallow trench isolation (STI) structure extending from the first surface into the substrate between the first active region and the second active region, the STI structure comprising:
        a first portion extending from the first surface with a first depth into the substrate, the first portion having a pair of sidewall surfaces extending from the first surface;
        a second portion extending away from the first portion, the second portion having a tip with a second depth less than the first depth, at least one dielectric material filling the first portion and the second portion, and the second portion has a polygonal shape; and
        a third portion extending away from the first portion in a direction perpendicular to the first surface, the third portion having a bottom tip greater than the first depth,
    wherein the sidewall surfaces of the pair of sidewall surfaces are substantially parallel to one another;
    a first doped region in the substrate, the first doped region being adjacent to the STI structure on a first side of the STI structure, the first doped region having a first conductivity type, and the first doped region directly contacts the first portion and the second portion;
    a second doped region in the substrate, the second doped region being adjacent to the STI structure on a second side of the STI structure opposite the first side, the second doped region having a second conductivity type; and
    a third doped region in the substrate, the third doped region being under the STI structure and between the first doped region and the second doped region, the third doped region having a third conductivity type, wherein a maximum depth of the third doped region is greater than a maximum depth of the first doped region and a maximum depth of the second doped region, the third doped region contacts at least two sidewalls of the STI structure, the third doped region directly contacts the first doped region and the second doped region, and sidewalls of the second portion above the tip are free of the third doped region,
    wherein the third conductivity type is different from the first conductivity type and the second conductivity type, and
    at least two sidewalls of the STI structure are each covered by two doped regions with different conductivity types.

8. The semiconductor structure of claim 7, wherein at least one of the sidewall surfaces of the first portion has a length in a range from 200 nm to 300 nm in a direction vertical to the first surface.

9. The semiconductor structure of claim 7, wherein the first depth is larger than 310 nm.

10. The semiconductor structure of claim 7, wherein the second depth is larger than 285 nm.

11. The semiconductor structure of claim 7, wherein a distance from the tip of the second portion of the sidewall surface to the first portion is larger than 25 nm.

12. The semiconductor structure of claim 7, wherein a distance from the tip of the second portion to a bottom surface of the first portion is larger than 20 nm.

13. The semiconductor structure of claim 7, wherein the second portion extends underlying the first active region or the second active region.

14. The semiconductor structure of claim 7, wherein the first active region and the second active region comprise high-k metal gate stacks.

15. The semiconductor structure of claim 7, wherein at least one dielectric material filling the STI structure comprise different dielectric materials with different etching resistances at different locations.

16. A semiconductor structure, comprising:
- a substrate including a first active region and a second active region, and having a top surface;
- a shallow trench isolation (STI) structure extending from the top surface into the substrate between the first active region and the second active region, the STI structure comprising:
  - a first portion extending from the top surface to a first depth into the substrate, the first portion having a sidewall surface perpendicular to the top surface, and a maximum depth of the sidewall surface is less than the first depth; and
  - a second portion extending from the first portion toward the first active region, the second portion having a tip with a second depth less than the first depth, at least one dielectric material filling the first portion and the second portion;
- a first doped region in the substrate, the first doped region being adjacent to the STI structure on a first side of the STI structure, the first doped region having a first conductivity type, and the first doped region directly contacts the first portion and the second portion;
- a second doped region in the substrate, the second doped region being adjacent to the STI structure on a second side of the STI structure opposite the first side, the second doped region having a second conductivity type; and
- a third doped region in the substrate, the third doped region being under the STI structure and between the first doped region and the second doped region, the third doped region having a third conductivity type, wherein a maximum depth of the third doped region is greater than a maximum depth of the first doped region and a maximum depth of the second doped region, the third doped region contacts at least two sidewalls of the STI structure, the third doped region directly contacts the first doped region and the second doped region, and sidewalls of the second portion above the tip are free of the third doped region,
- wherein the third conductivity type is different from the first conductivity type and the second conductivity type, and
- at least two sidewalls of the STI structure are each covered by two doped regions with different conductivity types.

17. The semiconductor structure of claim 16, wherein a distance D from the tip of the second portion to the first portion in a direction parallel to the top surface is greater than a distance T from the tip of the second portion to a bottom-most surface of the first portion in a direction perpendicular to the top surface.

18. The semiconductor structure of claim 16, wherein the at least one dielectric material comprises:
- a first dielectric material having a first etch resistance; and
- a second dielectric material having a second etch resistance different from the first etch resistance.

19. The semiconductor structure of claim 16, wherein the at least one dielectric material directly contacts the sidewall surface.

20. The semiconductor structure of claim 16, wherein
- the second portion has a second sidewall surface extending at an acute angle with respect to the top surface, and
- the sidewall surface of the first portion directly connects to the second sidewall surface.

* * * * *